United States Patent
Okuno

(10) Patent No.: US 10,439,098 B2
(45) Date of Patent: Oct. 8, 2019

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 16/058,802

(22) Filed: Aug. 8, 2018

(65) Prior Publication Data
US 2019/0067512 A1    Feb. 28, 2019

(30) Foreign Application Priority Data
Aug. 23, 2017   (JP) ................ 2017-160601

(51) Int. Cl.
| | |
|---|---|
| H01L 33/00 | (2010.01) |
| H01L 33/12 | (2010.01) |
| H01L 21/02 | (2006.01) |
| H01L 33/42 | (2010.01) |
| C30B 25/18 | (2006.01) |
| C30B 29/40 | (2006.01) |
| C30B 25/16 | (2006.01) |

(Continued)

(52) U.S. Cl.
CPC .......... *H01L 33/007* (2013.01); *C30B 25/165* (2013.01); *C30B 25/183* (2013.01); *C30B 25/186* (2013.01); *C30B 29/403* (2013.01); *H01L 21/0242* (2013.01); *H01L 21/0243* (2013.01); *H01L 21/0254* (2013.01); *H01L 21/0262* (2013.01); *H01L 21/02458* (2013.01); *H01L 33/12* (2013.01); *H01L 33/42* (2013.01); *H01L 33/22* (2013.01); *H01L 33/32* (2013.01); *H01L 2933/0016* (2013.01)

(58) Field of Classification Search
None
See application file for complete search history.

(56) References Cited

U.S. PATENT DOCUMENTS

| | | | |
|---|---|---|---|
| 8,709,843 | B2 | 4/2014 | Shakuda |
| 2009/0269867 | A1 | 10/2009 | Shakuda |

(Continued)

FOREIGN PATENT DOCUMENTS

| | | |
|---|---|---|
| JP | 2004-289095 A | 10/2004 |
| JP | 2008-078613 A | 10/2009 |
| WO | WO 2008/023774 A1 | 2/2008 |

*Primary Examiner* — Andres Munoz
(74) *Attorney, Agent, or Firm* — McGinn IP Law Group, PLLC

(57) ABSTRACT

To provide a method for producing a Group III nitride semiconductor light-emitting device, which allows the formation of a high-temperature AlN buffer layer on an uneven substrate. This production method comprises forming an Al layer or Al droplets on the uneven shape of the uneven substrate, forming an AlN buffer layer while nitriding the Al layer; and forming a Group III nitride semiconductor layer on the AlN buffer layer. In the forming an Al layer, the internal pressure of a furnace is 1 kPa to 19 kPa, the temperature of the uneven substrate is 900° C. to 1,500° C., and an organic metal gas containing Al is supplied at a flow rate of $1.5 \times 10^{-4}$ mol/min or more.

16 Claims, 6 Drawing Sheets

(51) Int. Cl.
*H01L 33/22* (2010.01)
*H01L 33/32* (2010.01)

(56) References Cited

U.S. PATENT DOCUMENTS

| | | | | |
|---|---|---|---|---|
| 2009/0309126 A1* | 12/2009 | Okuno | .................. | H01L 33/007 257/103 |
| 2011/0240956 A1* | 10/2011 | Saito | ....................... | H01L 33/02 257/13 |
| 2012/0126241 A1* | 5/2012 | Okuno | ................... | H01L 33/22 257/76 |
| 2013/0015487 A1* | 1/2013 | Okuno | ................... | H01L 33/20 257/98 |
| 2019/0074405 A1* | 3/2019 | Okuno | ............... | H01L 33/0079 |

* cited by examiner

METHOD FOR PRODUCING GROUP III NITRIDE SEMICONDUCTOR LIGHT-EMITTING DEVICE

BACKGROUND OF THE INVENTION

Field of the Invention

The present techniques relate to a method for producing a Group III nitride semiconductor light-emitting device.

Background Art

In the conventional techniques, when producing a Group III nitride semiconductor light-emitting device, a low-temperature buffer layer made of AlN or GaN is formed on a sapphire substrate. A Group III nitride semiconductor layer such as GaN layer is formed on the low-temperature buffer layer.

When a semiconductor layer is grown on the low-temperature buffer layer, after the formation of the low-temperature buffer layer, the temperature of the substrate is raised to 1,000° C. or more, which is preferable for growing the Group III nitride semiconductor layer. At this time, the low-temperature buffer layer is subjected to thermal stress during temperature rise of the substrate. Thereby, the quality of the low-temperature buffer layer may be deteriorated (see, paragraph [0008] of Patent Document 1). Moreover, it takes time to raise the temperature of the substrate.

Therefore, the techniques to form a high-temperature buffer layer have been developed. Patent Document 1 discloses the techniques to continuously supply Al raw material while intermittently supplying Al raw material after the supply of Al raw material was started (see, claim 1 and FIG. 1 of Patent Document 1). The techniques allow the formation of high-temperature buffer layer.

Patent Document 1: Japanese Patent Application Laid-Open (kokai) No. 2008-078613

The melting point of Al is approximately 660° C. Al is easily volatilized at a high temperature of 1,000° C. or more. Particularly in the uneven substrate, Al atoms hardly remain on the sapphire substrate. That is, Al atoms easily leave from the surface of the uneven substrate. Therefore, even if the techniques of Patent Document 1 are used, it is by no means easy to form a high-temperature AlN buffer layer on the uneven substrate.

SUMMARY OF THE INVENTION

The present techniques have been conceived for solving the aforementioned problems involved in conventional techniques. Thus, an object of the present techniques is to provide a method for producing a Group III nitride semiconductor light-emitting device, which allows the formation of a high-temperature AlN buffer layer on an uneven substrate.

In a first aspect of the present techniques, there is provided a method for producing a Group III nitride semiconductor light-emitting device, the method comprising an Al layer or Al droplets formation step of forming an Al layer or Al droplets on a surface of a substrate, the surface having an uneven shape comprising concaves and convexes, by flowing an organic metal gas containing Al without flowing an ammonia gas, an AlN buffer layer formation step of forming an AlN buffer layer while nitriding the Al layer or the Al droplets by flowing the organic metal gas containing Al and the ammonia gas, and a semiconductor layer formation step of forming a Group III nitride semiconductor layer on the AlN buffer layer. In the Al layer or the Al droplets formation step, the internal pressure of a furnace is set at any value in a range from 1 kPa to 19 kPa, the temperature of the substrate is set at any value in a range from 900° C. to 1,500° C., and an organic metal gas containing Al is supplied at a flow rate such that Al atoms are uniformly deposited on an entire surface of the substrate. Also the organic metal gas containing Al may be supplied at a flow rate such that Al atoms generated by decomposition of the organic metal gas containing Al can reach the entire surface from a near side to a far side of the substrate in a gas flow direction. In the forming the AlN buffer layer, the internal pressure of a furnace, the temperature of the substrate and the flow rate of the organic metal gas containing Al may be kept at the same values as when the Al layer or the Al droplets is formed. The flow rate of the organic metal gas containing Al may be $1.5 \times 10^{-4}$ mol/min or more. The flow rate of the organic metal gas containing Al may be preferably set at any value in a range from $1.5 \times 10^{-4}$ mol/min to $150 \times 10^{-4}$ mol/min. In the forming the Al layer or the Al droplets, the flow rate of the organic metal gas per the area of the cross section perpendicular to a gas flow direction at a position of the substrate may be set at any value in a range from $1.5 \times 10^{-6}$ mol/(min·cm$^2$) to $15 \times 10^{-6}$ mol/(min·cm$^2$). In the forming the Group III nitride semiconductor layer, the internal pressure of the furnace may be set at an atmospheric pressure.

In the method for producing a Group III nitride semiconductor light-emitting device, the Al layer or the Al droplets is formed on the uneven substrate, and an AlN buffer layer is formed while nitriding the Al layer. The AlN buffer layer is a high-temperature AlN buffer layer formed at a high temperature. The quality of the high-temperature AlN buffer layer is easily stabilized. Therefore, a semiconductor light-emitting device excellent in quality is achieved. The temperature of the substrate does not need to be raised or lowered during a period from the formation of the buffer layer to the formation of the semiconductor layer. Thus, the cycle time of the production method is short.

In the present specification, there is provided a method for producing a Group III nitride semiconductor light-emitting device in which a high-temperature AlN buffer layer is formed on the uneven substrate.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENT

Figure 1:
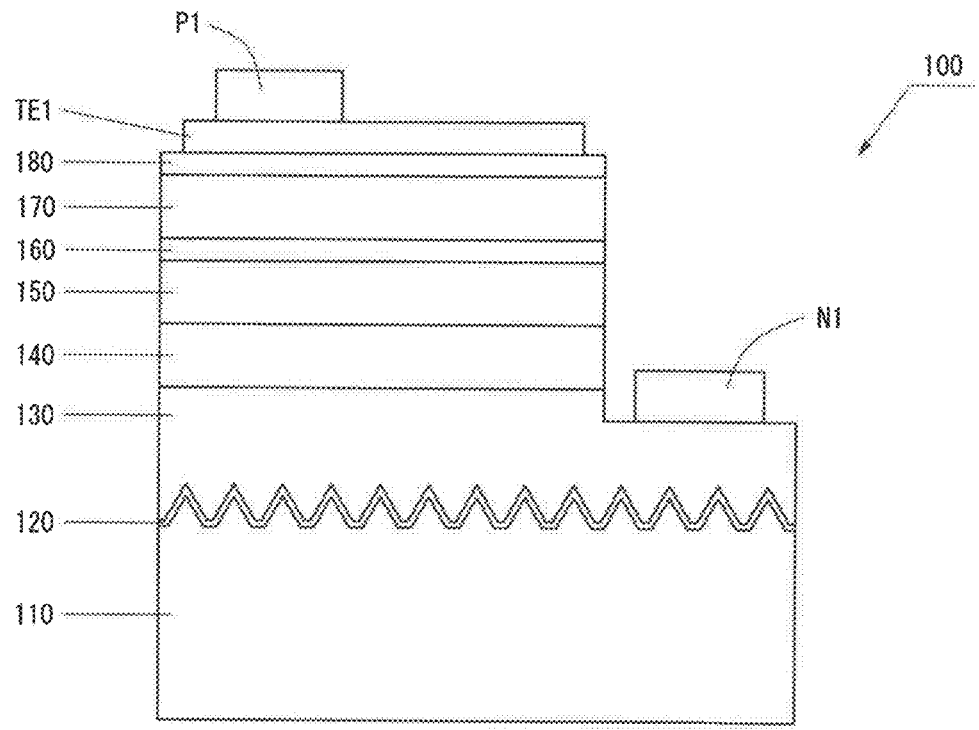
FIG. 1 is a schematic view showing the structure of a semiconductor light-emitting device in embodiment 1.

With reference to the drawings, specific embodiment of the production method for producing a semiconductor light-emitting device as an example will next be described in detail. However, this embodiment should not be construed as limiting the techniques thereto. The below-described depositing structure of the layers of the semiconductor light-emitting device and the electrode structure are given only for the illustration purpose, and other depositing structures differing therefrom may also be employed. The thickness of each of the layers shown in the drawings is not an actual value, but a conceptual value.

Embodiment 1

1. Semiconductor Light-Emitting Device

FIG. 1 is a schematic view showing the structure of a semiconductor light-emitting device of the present embodiment. The light-emitting device 100 is a face-up type semiconductor light-emitting device. The light-emitting device 100 has a plurality of Group III nitride semiconductor layers. As shown in FIG. 1, the light-emitting device 100 has a substrate 110, a buffer layer 120, an n-type contact layer 130, an n-side high electrostatic breakdown voltage layer 140, an n-side superlattice layer 150, a light-emitting layer 160, a p-side superlattice layer 170, a p-type contact layer 180, a transparent electrode TE1, a p-electrode P1, and an n-electrode N1.

On the main surface of the substrate 110, the buffer layer 120, the n-type contact layer 130, the n-side high electrostatic breakdown voltage layer 140, the n-side superlattice layer 150, the light-emitting layer 160, the p-side superlattice layer 170, and the p-type contact layer 180 are formed in this order. The n-electrode N1 is formed on the n-type contact layer 130. The p-electrode P1 is formed on the transparent electrode TE1. The n-type contact layer 130, the n-side high electrostatic breakdown voltage layer 140, and the n-side superlattice layer 150 are n-type semiconductor layers. The p-side superlattice layer 170 and the p-type contact layer 180 are p-type semiconductor layers. However, these layers may partially contain an undoped layer. Thus, the light-emitting device 100 has an n-type semiconductor layer, a light-emitting layer on the n-type semiconductor layer, a p-type semiconductor layer on the light-emitting layer, a transparent electrode TE1 on the p-type semiconductor layer, a p-electrode P1 on the transparent electrode TE1, and an n-electrode N1 on the n-type semiconductor layer.

The substrate 110 is a growth substrate for forming, on its main surface, the above semiconductor layers through MOCVD. The main surface is processed to have an uneven structure. The substrate 110 is made of sapphire. The substrate 110 may be made of, instead of sapphire, a material such as SiC, ZnO, or Si.

The buffer layer 120 is formed on the main surface of the substrate 110. The buffer layer 120 is used to form high-density crystal nuclei on the substrate 110. This promotes growth of a semiconductor crystal having a flat surface. The buffer layer 120 is made of AlN. The thickness of the buffer layer 120 is in a range of 5 nm to 35 nm. The buffer layer 120 is a high-temperature formed AlN buffer layer deposited at a high temperature of 900° C. or more.

The n-type contact layer 130 is, for example, n-type AlGaN ($0 \leq Al<1$) doped with Si. The n-type contact layer 130 is formed on the buffer layer 120. The n-type contact layer 130 is in contact with the n-electrode N1.

The n-side high electrostatic breakdown voltage layer 140 is provided to prevent electrostatic breakdown of the semiconductor layers. The n-side high electrostatic breakdown voltage layer 140 is formed on the n-type contact layer 130. The n-side high electrostatic breakdown voltage layer 140 is formed by depositing, for example, an i-AlGaN layer made of undoped i-AlGaN ($0 \leq Al<1$) and an n-type AlGaN layer made of n-type AlGaN ($0 \leq Al<1$) doped with Si.

The n-side superlattice layer 150 is a strain relaxation layer for relaxing stress applied to the light-emitting layer 160. More specifically, the n-side superlattice layer 150 has a superlattice structure. The n-side superlattice layer 150 is formed by repeatedly depositing, for example, an InGaN ($0 \leq In<1$) layer and an n-type AlGaN ($0 \leq Al<1$) layer. Needless to say, the n-side superlattice layer 150 may contain other semiconductor layer such as AlGaN layer.

The light-emitting layer 160 emits light through recombination of electrons and holes. The light-emitting layer 160 is formed on the n-side superlattice layer 150. The light-emitting layer includes at least a well layer and a barrier layer. The well layer may be, for example, an InGaN layer or a GaN layer. The barrier layer may be, for example, a GaN layer or an AlGaN layer. These are examples only, and another layer such as an AlInGaN layer may be used.

The p-side superlattice layer 170 is formed on the light-emitting layer 160. The p-side superlattice layer 170 is a p-type cladding layer. The p-side superlattice layer 170 is formed by repeatedly forming a layered structure formed by depositing, for example, a p-type GaN layer, a p-type AlGaN layer, and a p-type InGaN layer.

The p-type contact layer 180 is a semiconductor layer electrically connected to the p-electrode P1. Therefore, the p-type contact layer 180 is in contact with the p-electrode P1. The p-type contact layer 180 is formed on the p-side superlattice layer 170. The p-type contact layer 180 is made of p-type AlGaN ($0 \leq Al<1$) doped with Mg.

The transparent electrode TE1 is formed on the p-type contact layer 180. The material of the transparent electrode TE1 is ITO. A transparent conductive oxide other than ITO, such as IZO, ICO, ZnO, $TiO_2$, $NbTiO_2$, or $TaTiO_2$ can also be used.

The p-electrode P1 is formed on the transparent electrode TE1. The p-electrode P1 is electrically connected to the p-type contact layer 180 via the transparent electrode TE1. The p-electrode P1 is a metal electrode made of, for example, Ni, Au, Ag, Co, and In.

The n-electrode N1 is formed on the n-type contact layer 130. The n-electrode N1 is in contact with the n-type contact layer 130. The n-electrode N1 is a metal electrode made of, for example, Ni, Au, Ag, Co, and In.

2. Uneven Shape of Substrate

Figure 2:
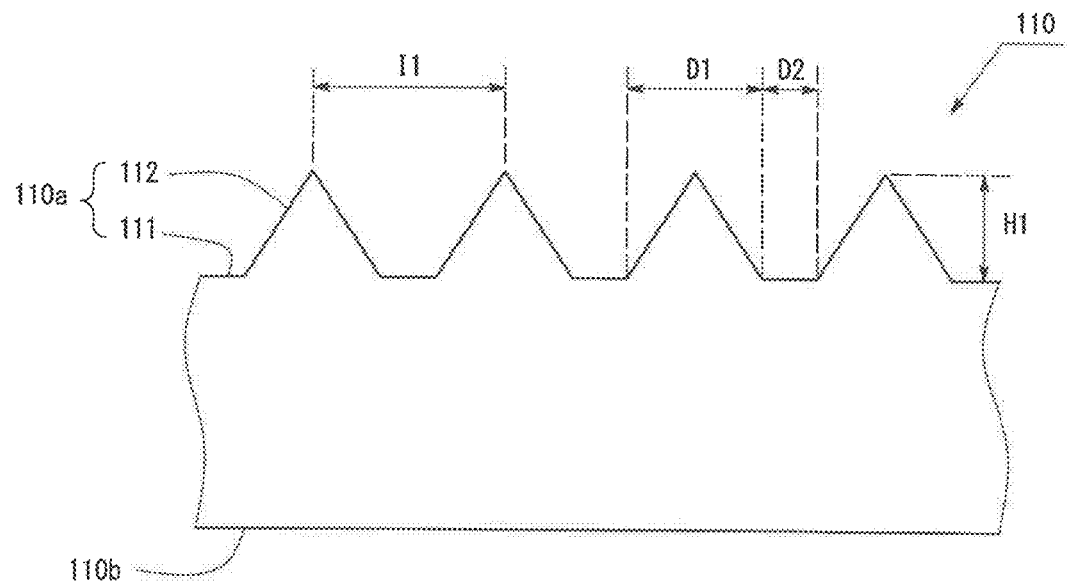
FIG. 2 is a view for illustrating an uneven shape of a substrate of the semiconductor light-emitting device in the embodiment 1.

FIG. 2 is a view for illustrating an uneven shape of the substrate 110 of the semiconductor light-emitting device of the present embodiment. As shown in FIG. 2, the substrate 110 has an uneven shape. The substrate 110 has a first surface 110a and a second surface 110b. The uneven shape is formed on the first surface 110a side. The first surface 110a of the substrate 110 has a bottom surface 111 and protrusions 112.

Each of the protrusions 112 has a hexagonal pyramid shape. Or each of the protrusions 112 may have a conical shape, a multiple truncated pyramid shape, or a truncated cone shape. The protrusions 112 are arranged in a honeycomb pattern on the first surface 110a of the substrate 110. That is, the tops of the protrusions 112 are disposed at the vertices and center positions of regular hexagons. Needless to say, the protrusions 112 do not need to be arranged in a honeycomb pattern. However, if the protrusions 112 are arranged in a honeycomb pattern, the protrusions can be densely disposed.

The height H1 of the protrusion 112 is in a range of 0.5 µm to 5 µm. The width D1 of the protrusion 112 is in a range of 0.5 µm to 5 µm. The width D2 of the bottom surface 111 between the adjacent protrusions 112 is in a range of 0.1 µm to 3 µm. The pitch interval I1 between the adjacent protrusions 112 is in a range of 0.6 µm to 10 µm. These numerical values are used only as a guide.

In the present embodiment, the ratio of the area occupied by the bottom surface 111 to the area of the first surface 110a of the substrate 110 is in a range of 10% to 50%, preferably, 15% to 45%. That is, the ratio of the area occupied by the protrusions 112 to the area of the first surface 110a of the substrate 110 is in a range of 50% to 90%, preferably, in a range of 55% to 85%. The density of number of the protrusions 112 in the first surface 110a of the substrate 110 is in a range of $8 \times 10^6/cm^2$ to $1 \times 10^7/cm^2$.

When the ratio of the area occupied by the protrusions 112 to the area of the first surface 110a of the substrate 110 is high, preferably, growth under a reduced pressure is carefully performed. The lower the internal pressure during growth in the semiconductor production apparatus, the more the semiconductor layer is laterally grown. This is because the migration of the raw material is promoted on the surface of the substrate. Under a high temperature condition, the migration of the raw material is further promoted on the surface of the substrate.

3. Production Apparatus (Vapor Phase Epitaxy Growth Apparatus)

Figure 3:
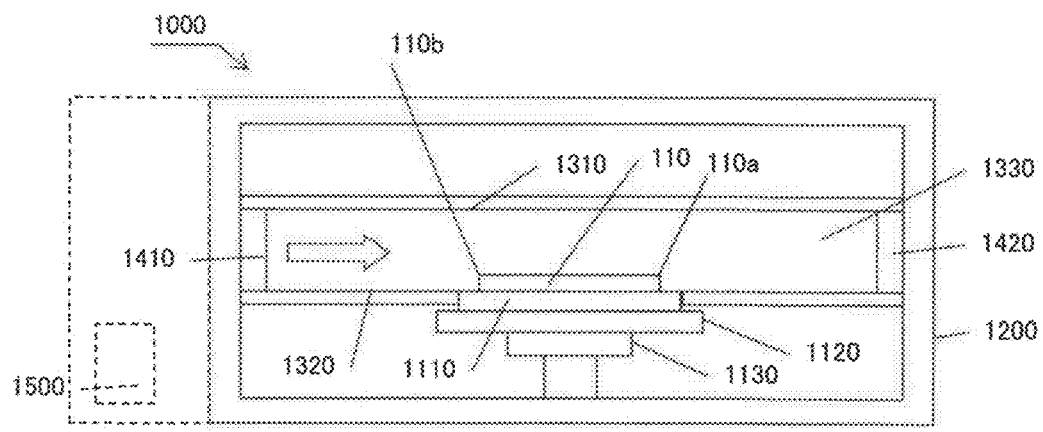
FIG. 3 is a schematic view showing the structure of the production apparatus used in producing the semiconductor light-emitting device in the embodiment 1.

FIG. 3 is a schematic view showing the structure of the production apparatus 1000 of the present embodiment. The production apparatus 1000 is a MOCVD furnace for epitaxially growing semiconductor layers on the growth substrate. The production apparatus 1000 is a type of vapor phase epitaxial growth apparatus. The production apparatus 1000 has a susceptor 1110, a heater 1120, a rotating shaft 1130, a chamber 1200, a nozzle 1410, a suction part 1420, and a controller 1500.

The susceptor 1110 is a support member for supporting the substrate 110 which can be disposed thereon. The heater 1120 is provided to heat the substrate 110. The heater 1120 may be a contact type which is in contact with the susceptor 1110 or a non-contact type which performs induction heating. The rotating shaft 1130 is provided to rotate the susceptor 1110. This can grow semiconductor layers on the substrate 110 while rotating the substrate 110.

The chamber 1200 is a furnace body for housing the parts. The nozzle 1410 is provided to supply a carrier gas or a raw material gas into the chamber 1200. When the production apparatus 1000 is used, the nozzle 1410 supplies a gas toward the substrate 110 disposed on the susceptor 1110. The suction part 1420 is provided to suck gas in the chamber 1200.

The chamber 1200 has a top surface 1310 of flow path, a bottom surface 1320 of flow path, and a side surface 1330 of flow path. The top surface 1310 of flow path, the bottom surface 1320 of flow path, and the side surface 1330 of flow path are provided to pass the gas supplied from the nozzle 1410 above the substrate 110 disposed on the susceptor 1110. As shown in FIG. 3, the production apparatus 1000 of the present embodiment sprays the gas to the substrate 110 from a lateral direction.

The controller 1500 is provided to control the parts of the production apparatus 1000. The controller 1500 serves as a flow rate controller to control the flow rate of the carrier gas and the raw material gas supplied from the nozzle. The controller 1500 controls the temperature of the heater 1120 or the rotation of the rotation shaft.

4. Method for Producing Semiconductor Light-Emitting Device

Next will be described a method for producing the light-emitting device 100 of the present embodiment. The method for producing the light-emitting device 100 of the present embodiment has features in the production step of the buffer layer 120. In the present embodiment, crystals forming the semiconductor layers are epitaxially grown through metal organic chemical vapor deposition (MOCVD).

This production method comprises an uneven substrate preparation step of preparing an uneven substrate having an uneven shape on the main surface thereof, an Al layer formation step of forming an Al layer on the uneven shape of the uneven substrate, an AlN buffer layer formation step of forming an AlN buffer layer while nitriding the Al layer, and a semiconductor layer formation step of forming a Group III nitride semiconductor layer on the AlN buffer layer.

Examples of the carrier gas employed include hydrogen ($H_2$), nitrogen ($N_2$), or a gas mixture of hydrogen and nitrogen ($H_2+N_2$). Any of these may be used in the steps described later, unless otherwise specified. Ammonia gas ($NH_3$) is used as a nitrogen source. Trimethylgallium (Ga($CH_3$)$_3$: "TMG") as a gallium source. Trimethylindium (In($CH_3$)$_3$: "TMI") is used as an indium source. Trimethylaluminum (Al($CH_3$)$_3$: "TMA") is used as an aluminum source. Silane ($SiH_4$) is used as an n-type dopant gas, and bis(cyclopentadienyl)magnesium (Mg($C_5H_5$)$_2$) is used as a p-type dopant gas.

4-1. Substrate Preparation Step

In the substrate preparation step, a substrate 110 having an uneven shape on a first surface 110a is prepared. More specifically, for example, a bottom surface 111 and a plurality of protrusions 112 are formed on the first surface 110*a* of the substrate 110 by dry etching with ICP.

4-2. Substrate Cleaning Step

Figure 4:
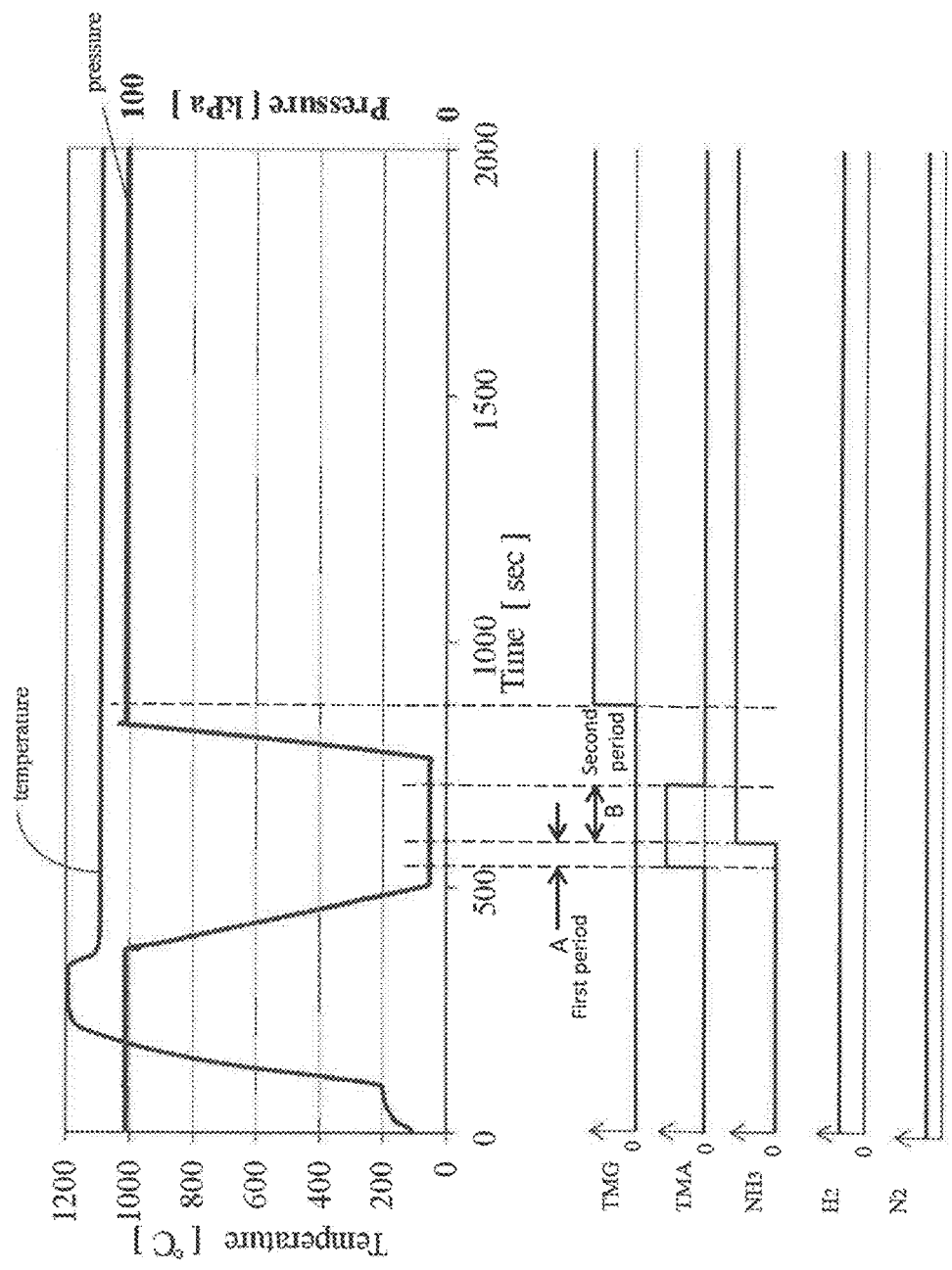
FIG. 4 is a timing chart of variations of temperature, pressure, and gas flows.

The substrate 110 is disposed on the susceptor 1110 of the production apparatus 1000 as shown in FIG. 3. Next, hydrogen gas and nitrogen gas are supplied into the chamber 1200 as shown in FIG. 4. The substrate is heated to a temperature of 1,200° C. and an internal pressure of the chamber 1200 is set at an atmospheric pressure, i.e. 100 kPa, as shown in FIG. 4. Thus, the surface of the substrate 110 is cleaned and reduced by the hydrogen gas. The temperature of the substrate 110 may be a temperature of 1,000° C. or more and the internal pressure of the chamber 1200 may be a reduced pressure.

4-3. Al Layer or Al Droplets Formation Step (First Period A)

Figure 5:
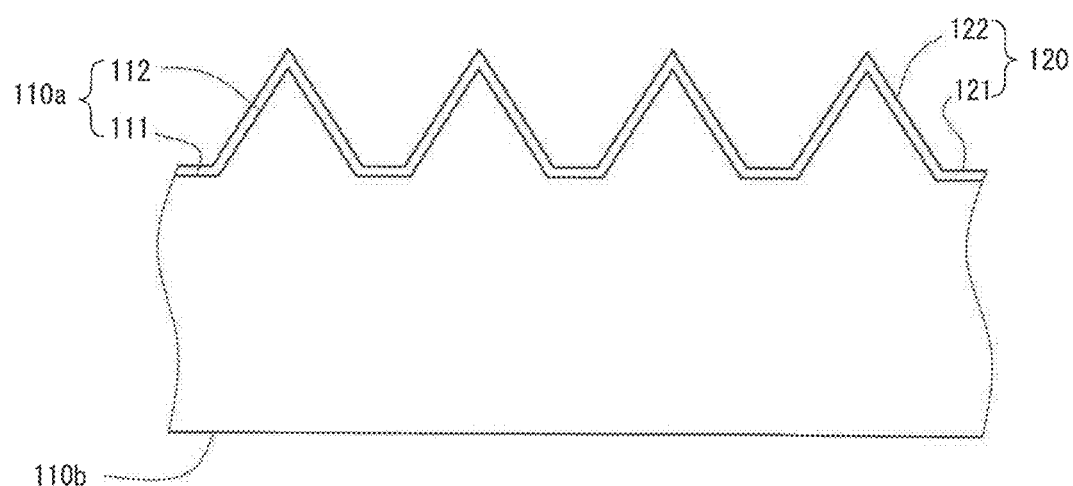
FIG. 5 is a view (part 1) for describing a method for producing the semiconductor light-emitting device in the embodiment 1.

As shown in FIG. 4, the internal pressure of the chamber 1200 of the production apparatus 1000 is reduced. In a first period A for forming an Al layer or Al droplets, the internal pressure of the production apparatus 1000 is reduced to 4 kPa and the temperature of the substrate is set at 1,080° C. However, the internal pressure of the production apparatus 1000 may be set at any pressure in a range of 1 kPa to 19 kPa, preferably, 1 kPa to 10 kPa. The temperature of the substrate is set at any temperature in a range of 900° C. to 1,500° C. In the first period A under this condition, TMA is supplied, the supply of the $H_2$ and $N_2$ gases is continued, and $NH_3$ gas is not supplied as shown in FIG. 4. TMA is an organic metal gas containing Al. The TMA supply rate is $1.5 \times 10^{-4}$ mol/min or more. An Al layer is formed on the first surface 110*a* of the substrate 110 in the first period A as shown FIG. 5. However, an Al droplet may be formed on the surface of the substrate 110 in the first period A. Thus, an Al-rich state is achieved on the surface of the substrate 110. This is because TMA is supplied at a high rate. The higher the supply rate of TMA, the better. However, the supply rate of TMA is actually $150 \times 10^{-4}$ mol/min or less, more preferably $15 \times 10^{-4}$ mol/min or less. The supply rate of TMA is desirably set such that Al atoms are uniformly deposited on the entire surface of the substrate. In other word, the supply rate of TMA is desirably set such that Al atoms generated by decomposition of TMA can reach the entire surface from a near side 110*b* to a far side 110*a* of the substrate 110 in a gas flow direction and be deposited on the entire surface of the substrate.

The gas flow rate to the cross section area of the gas flow path will be described. The flow rate of the organic metal gas per the area of the cross section perpendicular to a gas flow direction at a position of the susceptor of the production apparatus 1000 is $1.5 \times 10^{-6}$ mol/(min·cm$^2$) to $150 \times 10^{-6}$ mol/(min·cm$^2$), preferably, $1.5 \times 10^{-6}$ mol/(min·cm$^2$) to $150 \times 10^{-6}$ mol/(min·cm$^2$), more preferably $2.0 \times 10^{-6}$ mol/(min·cm$^2$) to $15 \times 10^{-6}$ mol/(min·cm$^2$), and most preferably, $3.7 \times 10^{-6}$ mol/(min·cm$^2$) to $7.5 \times 10^{-6}$ mol/(min·cm$^2$). Here the area of the cross section is 100 cm$^2$.

4-4. AlN Buffer Layer Formation Step (Second Period B)

Figure 6:
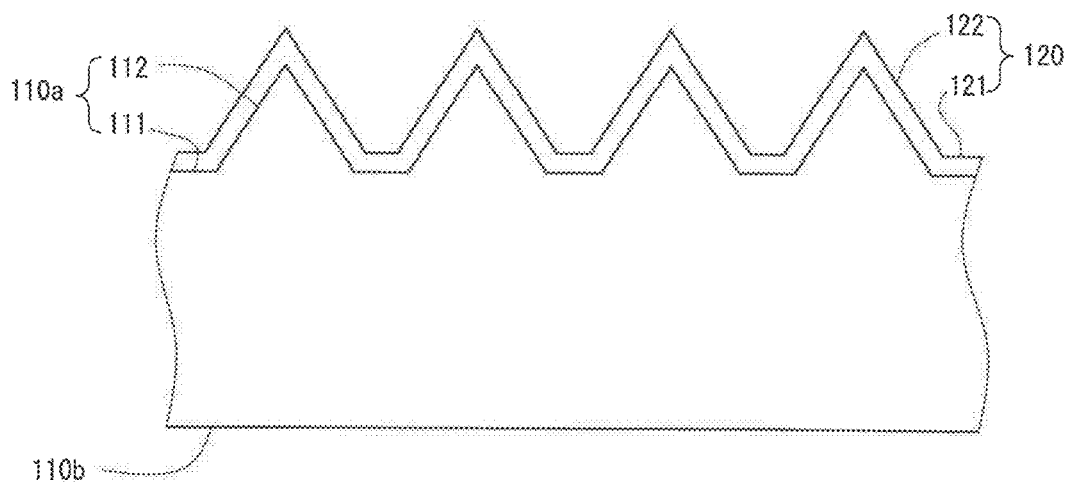
FIG. 6 is a view (part 2) for describing the method for producing the semiconductor light-emitting device in the embodiment 1.

$NH_3$ is supplied for the first time while continuing the supply of TMA in the second period B as shown FIG. 4. The melting point of Al is in the vicinity of 660° C., and Al is easily volatilized under the above conditions. In this step, the AlN buffer layer is formed by nitriding the Al layer already formed through the supply of $NH_3$, and the AlN buffer layer is further formed through the supply of TMA and $NH_3$. As shown in FIG. 6, the AlN buffer layer having a thickness of 5 nm to 35 nm is formed. The temperature of the substrate and the internal pressure of the chamber in this step may be the same as in the Al layer formation step. That is, the temperature of the substrate is 900° C. to 1,500° C. The internal pressure of the chamber 1200 is 1 kPa to 19 kPa. Through this step, the buffer layer 120 is formed on the substrate 110. The buffer layer 120 is a high-temperature AlN buffer layer as described above.

4-5. n-Type Contact Layer Formation Step

Subsequently, an n-type contact layer 130 is formed on the buffer layer 120. The internal pressure of the chamber 1200 is raised to the atmospheric pressure, i.e. 100 kPa, as shown in FIG. 4. However, the internal pressure of the chamber 1200 in this process may be reduced pressure. The temperature of the substrate in this process is in a range of 900° C. to 1,200° C. The temperature of the substrate is preferably the same as that in the buffer layer formation step. Thereby, the n-type contact layer 130 can be formed with no waiting time, immediately after the formation of the buffer layer 120. Thus, the n-type contact layer 130 is formed. The n-type contact layer 130 may be facet-grown.

4-6. n-Side High Electrostatic Breakdown Voltage Layer Formation Step

An n-side high electrostatic breakdown voltage layer 140 is formed on the n-type contact layer 130. To form an i-GaN layer, the supply of silane ($SiH_4$) is stopped. The temperature of the substrate in this process is in a range of 750° C. to 950° C. To form an n-type GaN, silane ($SiH_4$) is supplied again. The temperature of the substrate in this process is the same as the temperature for forming the i-GaN layer, that is, in a range of 750° C. to 950° C. The internal pressure of the production apparatus 1000 in this process may be either atmospheric pressure or reduced pressure.

4-7. n-Side Superlattice Layer Formation Step

An n-side superlattice layer 150 is formed on the n-side high electrostatic breakdown voltage layer 140 by repeatedly depositing, for example, an InGaN layer and an n-type GaN layer. The temperature of the substrate is in a range of 700° C. to 950° C. The internal pressure of the production apparatus 1000 in this process may be either atmospheric pressure or reduced pressure.

4-8. Light-Emitting Layer Formation Step

A light-emitting layer 160 is formed on the n-side superlattice layer 150 by repeatedly depositing, for example, an InGaN layer, a GaN layer, and an AlGaN layer. The temperature of the substrate in this process is in a range of 700° C. to 900° C. The internal pressure of the production apparatus 1000 in this process may be either atmospheric pressure or reduced pressure.

4-9. p-Side Superlattice Layer Formation Step (p-Type Cladding Layer Formations Step)

A p-side superlattice layer 170 is formed on the light-emitting layer 160 by repeatedly depositing, for example, a p-type GaN layer, a p-type AlGaN layer, and a p-type InGaN layer. Bis(cyclopentadienyl)magnesium ($Mg(C_5H_5)_2$) may be used as a dopant gas. The internal pressure of the production apparatus 1000 in this process may be either atmospheric pressure or reduced pressure.

4-10. p-Type Contact Layer Formation Step

Figure 7:
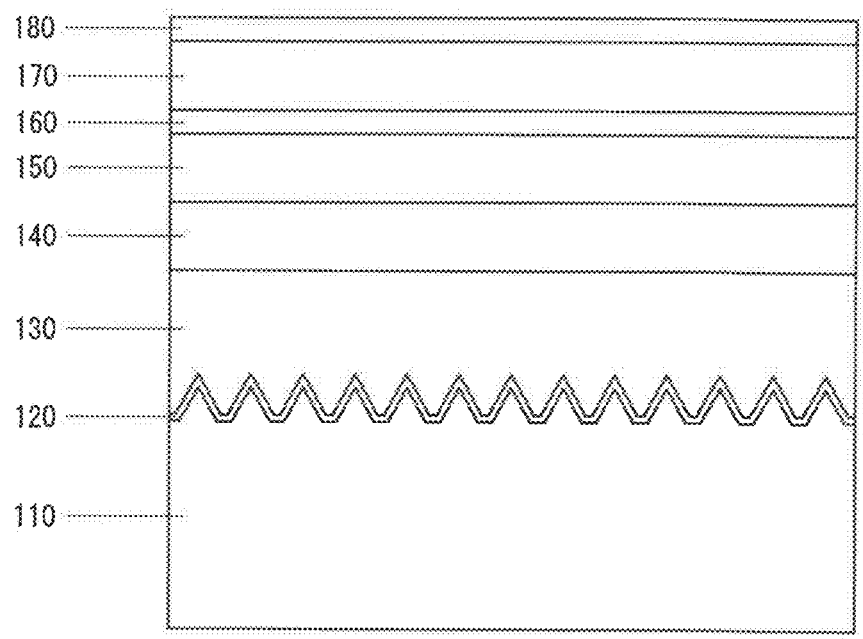
FIG. 7 is a view (part 3) for describing the method for producing the semiconductor light-emitting device in the embodiment 1.

A p-type contact layer 180 is formed on the p-side superlattice layer 170. At least hydrogen gas is supplied as a carrier gas. Thereby, the surface flatness of the p-type contact layer 180 is improved. The temperature of the substrate is in a range of 800° C. to 1,200° C. As shown in FIG. 7, the semiconductor layers are deposited on the substrate 110. The internal pressure of the production apparatus 1000 in this process may be either atmospheric pressure or reduced pressure.

4-11. Transparent Electrode Formation Step

A transparent electrode TE1 is formed on the p-type contact layer 180. In this process, sputtering or vapor deposition may be employed.

4-12. Electrode Formation Step

Figure 8:
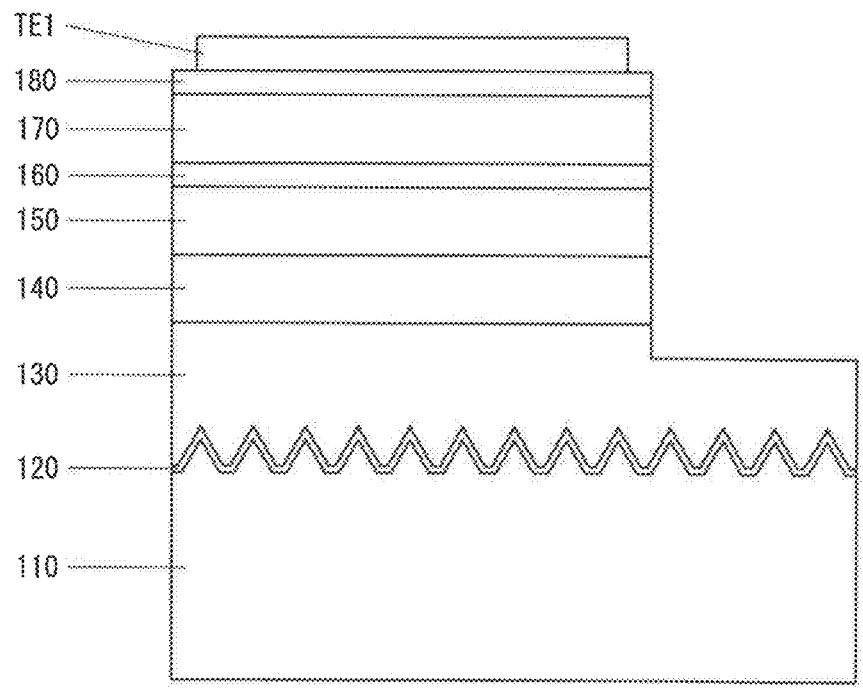
FIG. 8 is a view (part 4) for describing the method for producing the semiconductor light-emitting device in the embodiment 1.

Next, as shown in FIG. 8, part of the semiconductor layers is removed from the p-type contact layer 180 side using a laser or by etching to expose the n-type contact layer 130. Then, the n-electrode N1 is formed on the exposed portion of the n-type contact layer 130. A p-electrode P1 is formed on the transparent electrode TE1. The step of forming the p-electrode P1 may be performed before the step of forming the n-electrode N1, or the step of forming the n-electrode N1 may be performed before the step of forming the p-electrode P1.

4-13. Other Steps

In addition to the steps described above, other steps such as the step of covering the device with an insulating film and a heat treatment step may be performed. Through the steps described above, the light-emitting device 100 shown in FIG. 1 is produced.

Figure 9:
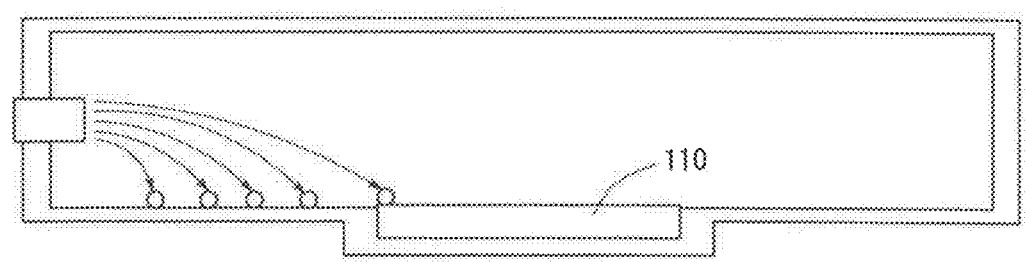
FIG. 9 is a view for describing the case when an organic metal gas containing Al is supplied to a substrate in the conventional techniques.

5. Comparison Between the Techniques of Embodiment and the Conventional Techniques 5-1. Conventional Techniques TMA is easily decomposed at a high temperature. Therefore, as shown in FIG. 9, most Al atoms hardly reach the substrate 110 at a high temperature. That is, most Al atoms are consumed by being deposited in the susceptor or the inner wall of the chamber before reaching the substrate 110. Even if the Al atoms reach the substrate 110, the Al atoms are difficult to be uniformly supplied on the surface of the substrate 110. Accordingly, it is extremely difficult to deposit the Al layer on the substrate 110.

In the conventional techniques, the organic metal gas containing Al is supplied at a rate of approximately $0.5 \times 10^{-4}$ mol/min.

5-2. Techniques of Embodiment

In the present embodiment, the internal pressure of the chamber 1200 is 1 kPa to 19 kPa, the temperature of the substrate is 900° C. to 1,500° C., and the organic metal gas containing Al is supplied at a rate of $1.5 \times 10^{-4}$ mol/min or more. Since the internal pressure of the chamber 1200 is low, the mean free path of the gas in the chamber 1200 is long. Therefore, TMA reaches the position of the substrate 110 before consumption through decomposition.

Under this environment, Al is easily evaporated. In the substrate 110 having an uneven shape, Al is extremely easily evaporated. In the present embodiment, TMA is supplied at such a high rate that the supply rate of the gas containing Al atoms exceeds the evaporation rate of the Al atoms. Therefore, the Al atoms are deposited on the first surface 110a of the substrate 110 before Al is evaporated.

As a result, in the present embodiment, the formation temperature of the buffer layer 120 is almost the same as the formation temperature of the Group III nitride semiconductor. Therefore, in the present embodiment, no time is required to raise the temperature of the substrate during a period from the formation of the buffer layer 120 to the formation of the semiconductor layer. That is, the cycle time is short in the present embodiment.

The quality of the high-temperature AlN buffer layer has higher stability than the quality of the low-temperature buffer layer.

6. Variations 6-1. Semiconductor Layer Formation Method

After the buffer layer 120 was formed on the substrate 110, semiconductor layers may be formed through other vapor phase epitaxy growth method such as HVPE. Semiconductor layers may be formed through other liquid phase epitaxy growth method. However, the cycle time is short when semiconductor layers are continuously formed through MOCVD.

6-2. Uneven Shape of Substrate

The uneven shape of the substrate 110 is not limited to those described in the embodiment. The protrusions may not be arranged in a honeycomb pattern. The recesses may be formed instead of the protrusions.

6-3. Flip-Chip

The light-emitting device 100 of the present embodiment is a face-up type light-emitting device. However, the techniques of the specification are applicable to a flip-chip type light-emitting device.

6-4. Combination

The above-described variations may be combined appropriately.

7. Summary of Present Embodiment

As described above in detail, in the method for producing the light-emitting device 100 according to the present embodiment, an Al layer is formed on an uneven substrate, an AlN buffer layer is formed while nitriding the Al layer. The AlN buffer layer is a high-temperature AlN buffer layer formed at a high temperature. The quality of the high-temperature AlN buffer layer is easily stabilized. Therefore, the semiconductor light-emitting device excellent in quality is achieved. The temperature of the substrate does not need to be raised or lowered during a period from the formation of the buffer layer to the formation of the semiconductor layer. Thus, the cycle time is short in this production method.

The above-described embodiment is merely an example. Accordingly, needless to say, the embodiment may be improved or modified in various ways without departing from the scope of the present techniques. The depositing structure of the layered stack is not necessarily limited to the above-illustrated structure. The depositing structure or the thickness, etc. may be freely selected.

8. Experiment

8-1. Substrate

A sapphire substrate was used as an uneven substrate. On the sapphire substrate, hexagonal pyramidal protrusions are arranged in a honeycomb pattern as shown in FIG. 2. The height H1 of each protrusion 112 is 1.9 μm. The width D1 of each protrusion 112 is 3 μm. The width D2 of the bottom surface 111 between the adjacent protrusions 112 is 0.5 μm. The pitch interval I1 between the adjacent protrusions 112 is 3.5 μm.

8-2. Formation of AlN Buffer Layer

As an example, a high-temperature AlN buffer layer was formed on an uneven substrate in a MOCVD furnace. The temperature of the substrate was 1,080° C. The internal pressure of the furnace was 4 kPa. Under this condition, firstly TMA was supplied without supplying $NH_3$. The supply rate of TMA was $2.0 \times 10^{-4}$ mol/min. TMA was supplied for one minute. The AlN buffer layer was formed by supplying $NH_3$ while continuing the supply of TMA. The supply rate of TMA was $2.0 \times 10^{-4}$ mol/min.

As a comparative example, a high-temperature AlN buffer layer was formed on an uneven substrate in a MOCVD furnace. The temperature of the substrate was 1,080° C. The internal pressure of the furnace was 4 kPa. Under this condition, firstly TMA was supplied without supplying $NH_3$. The supply rate of TMA was $1.0 \times 10^{-4}$ mol/min. TMA was supplied for two minutes. The AlN buffer layer was formed by supplying $NH_3$ while continuing the supply of TMA. The supply rate of TMA was $1.0 \times 10^{-4}$ mol/min. Thus, the total amount of TMA supplied is the same between the example and the comparative example.

8-3. Formation of Semiconductor Layer

In both the example and the comparative example, the internal pressure of the furnace was raised to one atmospheric pressure without changing the temperature of the substrate. A GaN layer having a thickness of 2 μm was formed on the high-temperature AlN buffer layer. Then, the temperature of the substrate was raised up to 1,150° C. to flatten the GaN layer. A GaN layer having a thickness of 4 μm was further formed.

8-4. Optical Microscope Image

Figure 10:
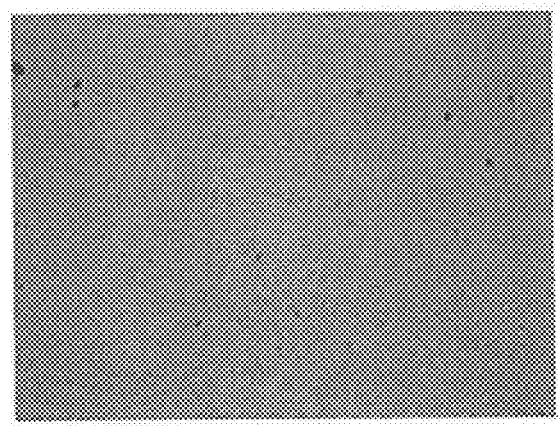
FIG. 10 is an optical microscope image showing the surface of the GaN layer in the example.

FIG. 10 is an optical microscope image showing the surface of the GaN layer in an example of the present experiment. As shown in FIG. 10, the surface of the GaN layer is flat in the example.

Figure 11:
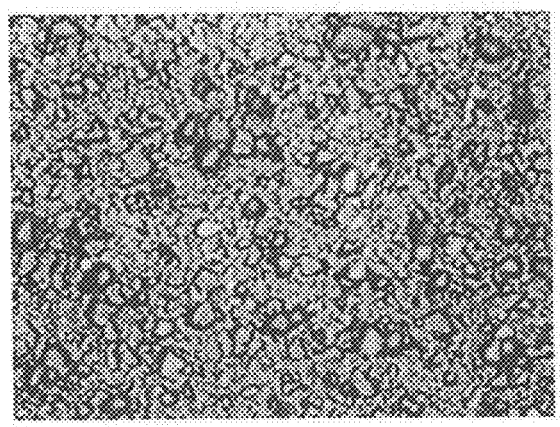
FIG. 11 is an optical microscope image showing the surface of the GaN layer in the comparative example.

FIG. 11 is an optical microscope image showing the surface of the GaN layer in the comparative example of the present experiment. As shown in FIG. 11, the surface of the GaN layer is extremely rough in the comparative example. From these experiments it is understood that the adequate supply rate of TMA greatly contributes to the crystalline of the semiconductor grown on the AlN buffer layer. It was found that the supply rate of TMA of $1.5 \times 10^{-4}$ mol/min or more is necessary to obtain a good crystalline of the semiconductor grown on the AlN buffer layer.

8-5. Summary of Experiment

The AlN buffer layer needs to be formed at a low pressure to increase the reaching distance of TMA. However, Al atoms are easily evaporated at a low pressure. When the substrate has an uneven shape, the Al atoms are easily separated from the substrate. Thus, to form or deposit Al on the uneven substrate from which the Al atoms are easily evaporated, the supply rate of the organic metal gas needs to be higher than the evaporation rate of the Al atoms.

What is claimed is:

1. A method for producing a Group III nitride semiconductor light-emitting device comprising:
   forming an Al layer or Al droplets on a surface of a substrate, the surface having an uneven shape comprising concave and convex portions, by flowing an organic metal gas containing Al without flowing an ammonia gas;
   forming an AlN buffer layer while nitriding the Al layer or the Al droplets by flowing the organic metal gas containing Al and the ammonia gas; and
   forming a Group III nitride semiconductor layer on the AlN buffer layer;
   wherein in the forming the Al layer or the Al droplets, an internal pressure of a furnace is set at any value in a range from 1 kPa to 19 kPa, a temperature of the substrate is set at any value in a range from 900° C. to 1,500° C., and the organic metal gas containing Al is supplied at a flow rate such that Al atoms are uniformly deposited on an entire surface of the substrate.

2. The method for producing a Group III nitride semiconductor light-emitting device according to claim 1, wherein in the forming the AlN buffer layer, the internal pressure of the furnace, the temperature of the substrate and the flow rate of the organic metal gas containing Al are kept at the same values as when the Al layer or the Al droplets is formed.

3. The method for producing a Group III nitride semiconductor light-emitting device according to claim 2, wherein in the forming the Group III nitride semiconductor layer, the internal pressure of the furnace is set at an atmospheric pressure.

4. The method for producing a Group III nitride semiconductor light-emitting device according to claim 3, wherein the flow rate of the organic metal gas containing Al is set at any value in a range from $1.5 \times 10^{-4}$ mol/min to $150 \times 10^{-4}$ mol/min.

5. The method for producing a Group III nitride semiconductor light-emitting device according to claim 3, wherein in the forming the Al layer or the Al droplets, the flow rate of the organic metal gas per an area of a cross section perpendicular to a gas flow direction at a position of the substrate is set at any value in a range from $1.5 \times 10^{-6}$ mol/(min·cm$^2$) to $15 \times 10^{-6}$ mol/(min·cm$^2$).

6. The method for producing a Group III nitride semiconductor light-emitting device according to claim 3, wherein the Group III nitride semiconductor layer is facet-grown in the forming a Group III nitride semiconductor layer.

7. The method for producing a Group III nitride semiconductor light-emitting device according to claim 2, wherein the flow rate of the organic metal gas containing Al is set at any value in a range from $1.5 \times 10^{-4}$ mol/min to $150 \times 10^{-4}$ mol/min.

8. The method for producing a Group III nitride semiconductor light-emitting device according to claim 2, wherein the Group III nitride semiconductor layer is facet-grown in the forming a Group III nitride semiconductor layer.

9. The method for producing a Group III nitride semiconductor light-emitting device according to claim 1, wherein the organic metal gas containing Al is supplied at a flow rate such that Al atoms generated by decomposition of the organic metal gas containing Al can reach the entire surface from a near side to a far side of the substrate in a gas flow direction.

10. The method for producing a Group III nitride semiconductor light-emitting device according to claim 9, wherein in the forming the Al layer or the Al droplets, the flow rate of the organic metal gas per an area of a cross section perpendicular to a gas flow direction at a position of the substrate is set at any value in a range from $1.5 \times 10^{-6}$ mol/(min·cm$^2$) to $15 \times 10^{-6}$ mol/(min·cm$^2$).

11. The method for producing a Group III nitride semiconductor light-emitting device according to claim 1, wherein in the forming the Group III nitride semiconductor layer, the internal pressure of the furnace is set at an atmospheric pressure.

12. The method for producing a Group III nitride semiconductor light-emitting device according to claim 1, wherein the flow rate of the organic metal gas containing Al is set at any value in a range from $1.5 \times 10^{-4}$ mol/min to $150 \times 10^{-4}$ mol/min.

13. The method for producing a Group III nitride semiconductor light-emitting device according to claim 1, wherein in the forming the Al layer or the Al droplets, the flow rate of the organic metal gas per an area of a cross section perpendicular to a gas flow direction at a position of the substrate is set at any value in a range from $1.5 \times 10^{-6}$ mol/(min cm$^2$) to $15 \times 10^{-6}$ mol/(min cm$^2$).

14. The method for producing a Group III nitride semiconductor light-emitting device according to claim 1, wherein the Group III nitride semiconductor layer is facet-grown in the forming a Group III nitride semiconductor layer.

15. The method for producing a Group III nitride semiconductor light-emitting device according to claim 1, wherein the substrate is made of sapphire, the substrate is cleaned and reduced in a temperature of 1000° C. or more by hydrogen gas at atmospheric pressure before the forming the Al layer or the Al droplets.

16. The method for producing a Group III nitride semiconductor light-emitting device according to claim 1, wherein the AlN buffer layer is formed at any thickness in a range from 5 nm to 35 nm.

* * * * *